US005946238A

United States Patent [19]
Campardo et al.

[11] Patent Number: 5,946,238
[45] Date of Patent: Aug. 31, 1999

[54] SINGLE-CELL REFERENCE SIGNAL GENERATING CIRCUIT FOR READING NONVOLATILE MEMORY

[75] Inventors: Giovanni Campardo, Bergamo; Rino Micheloni, Turate; Stefano Commodaro, Bogliasco, all of Italy

[73] Assignee: STMicroelectronics, S.r.l., Agrate Brianza, Italy

[21] Appl. No.: 08/877,066

[22] Filed: Jun. 17, 1997

[30] Foreign Application Priority Data

Jun. 18, 1996 [EP] European Pat. Off. .............. 96830348

[51] Int. Cl.[6] .................................................. G11C 16/06
[52] U.S. Cl. .................................. 365/185.2; 365/185.21; 365/189.09
[58] Field of Search ........................... 365/185.2, 185.21, 365/189.07, 189.09, 210

[56] References Cited

U.S. PATENT DOCUMENTS

| | | | |
|---|---|---|---|
| 4,393,475 | 7/1983 | Kitagawa et al. | 365/201 |
| 5,289,412 | 2/1994 | Frary et al. | 365/185 |
| 5,386,388 | 1/1995 | Atwood | 365/201 |
| 5,627,790 | 5/1997 | Golla | 365/210 |
| 5,638,326 | 6/1997 | Hollmer | 365/185.2 |
| 5,654,919 | 8/1997 | Kwon | 365/185.21 |
| 5,659,503 | 8/1997 | Sudo | 365/185.2 |
| 5,729,492 | 3/1998 | Campardo | 365/185.21 |
| 5,757,697 | 5/1998 | Briner | 365/185.21 |
| 5,764,570 | 6/1998 | Pascucci | 365/185.21 |

FOREIGN PATENT DOCUMENTS

WO 90/12400  10/1990  WIPO .

*Primary Examiner*—Son Mai
*Attorney, Agent, or Firm*—David V. Carlson; Seed and Berry LLP

[57] ABSTRACT

A nonvolatile memory having a memory array including a plurality of data cells and a read circuit. The read circuit includes a plurality of sense amplifiers, each connected to a respective array branch to be connected to the data cells. The nonvolatile memory also includes a reference generating circuit including a single reference cell arranged outside the memory array and generates a reference signal. The reference generating circuit includes a plurality of reference branches, each connected to a respective sense amplifier, and circuits interposed between the reference cell and the reference branches to supply the reference branches with a signal based on the reference signal.

20 Claims, 3 Drawing Sheets

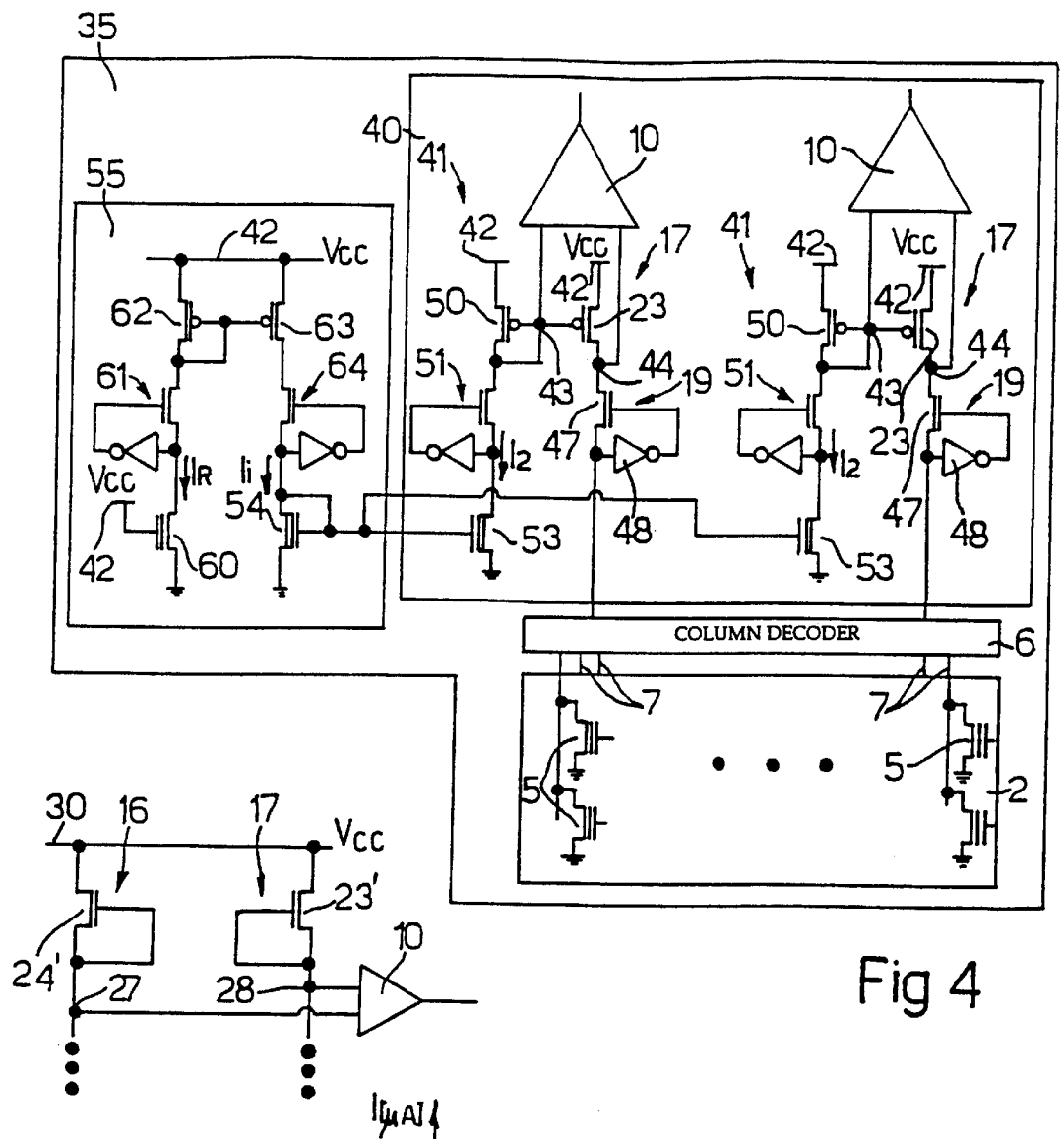
Fig 4
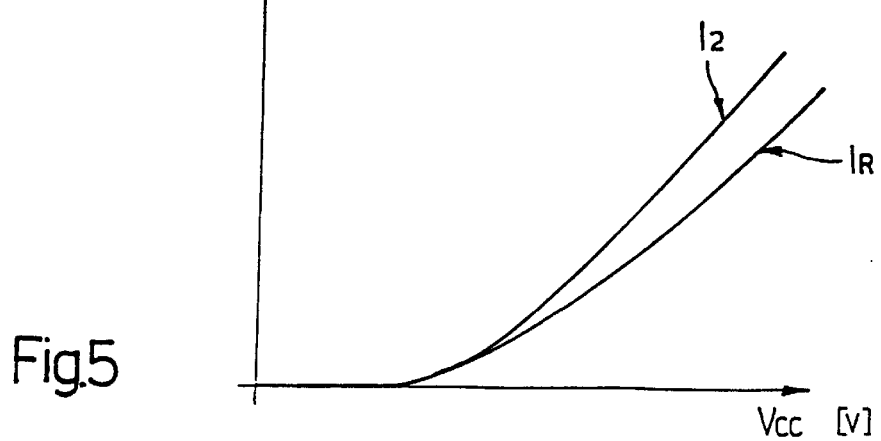
Fig.3
Fig.5

SINGLE-CELL REFERENCE SIGNAL GENERATING CIRCUIT FOR READING NONVOLATILE MEMORY

TECHNICAL FIELD

The present invention relates to a nonvolatile memory with a single-cell reference signal generating circuit for reading data cells in the nonvolatile memory.

BACKGROUND OF THE INVENTION

As is known, to read data cells of nonvolatile, particularly flash, memories, a row and a column to which a data cell to be read is connected are appropriately biased and current flowing through the data cell is detected. If the data cell is written, its threshold voltage is higher than a read voltage and the data cell conducts no current. If the data cell is erased, its threshold voltage is lower than the read voltage, and the data cell conducts current. Written and erased data cells are discriminated by comparing the current flowing in the data cell with a reference current generated by a reference cell.

As such, reading accuracy depends largely on an efficient operation of the reference cells and, more specifically, on having characteristics of the reference cells being as similar as possible to those of the data cells (i.e., a spread of the electrical characteristics of the reference cells is undesirable).

However, since the need to minimize spread conflicts with other design requirements, two different approaches exist in the design of reference cells. In a first approach, the data cells and the respective reference cells with which they are compared are located as close as possible to one another. In a second approach, the reference cells are located outside a memory array of data cells.

The first approach is used, for example, in EPROM memories, in which a column of an array for each output bit is used as a reference. Such a solution is shown by way of example in FIG. 1, in which a memory array is divided into two subarrays 2a and 2b, connected to a row decoder 3 for addressing several word lines 4, which are in turn connected to gate terminals of a plurality of data cells 5 and reference cells 9. Each data cell 5 and each reference cell 9 includes a drain terminal and a source terminal. The drain terminals of the data cells 5 are connected to respective bit lines 7 (one for each column in the array not used as a reference), which are in turn connected by two column decoders 6a and 6b to a plurality of sense amplifiers 10. Each sense amplifier 10 includes a first input connected to one bit line 7 addressed by the column decoders 6a and 6b; and a second input connected to a respective reference line 8, to which the reference cells 9 in the same reference column are connected.

This first approach presents several advantages. In particular, spread is minimized because each data cell 5 is located close to a respective reference cell 9. The reference cell 9 is turned on together with the data cell 5 to be read as both are connected to the same word line to eliminate any timing problems. Further, load transistors (not shown) in the data and reference branches connected to the inputs of the sense amplifiers 10 are the same. On the other hand, the first approach also presents disadvantages. The reference cells 9 are subjected to stress by undergoing the same operations as the data cells 5. The first approach is also particularly bulky in that one column of the array for each output bit cannot be used for storing data.

When applied to flash memories, further disadvantages of the first approach are encountered. First of all, a ground of the reference columns must be separate from the rest of the subarray to which they belong, otherwise their data cells 5 would become depleted when erasing via the source terminal. Furthermore, the reference columns are subjected to stress which may lead to cycling problems in multiple erase and write cycle operations. Finally, in the event of an undesirable UV threshold being obtained during fabrication, it is not feasible to match the threshold voltages of individual reference cells, e.g., to correct the threshold voltages of all the cells in the same column.

The second approach provides for a writing and erasing of reference cells during testing so as to obtain the best possible reference. On the other hand, the characteristic spread of the reference cells assumes greater importance because of the physical distance between the reference cells and respective data cells and between the reference cells themselves. One solution to the problem is to use a single reference cell, e.g., a single reference branch connected to a plurality of sense amplifiers as shown in FIG. 2. Two sense amplifiers 10 each have a first input connected to a common reference branch 16, and a second input connected to a respective array branch 17. A column decoder 18 is interposed between two bit lines 7 and two respective biasing circuits 19. A current/voltage converter 20 for converting current flowing in two data cells 5 and in a single reference cell 22 is shown. The converter 20 comprises a PMOS load transistor 23 for each array branch 17, and a diode-connected PMOS load transistor 24 for a common reference branch 16.

In the circuit shown in FIG. 2, two capacitors 25 represent a parasitic capacitance between a gate terminal 27 and a drain terminal 28 of each load transistor 23. Two capacitors 26 represent capacitances of the other bit lines (not shown) connected to the array branches 17 via the column decoder 18. The capacitors 25 and 26 form capacitive couplings between the array branches 17 and the common reference branch 16 so that when outputs of the sense amplifiers 10 switch, a voltage shift in the array branch 17 of each sense amplifier 10 may result in read problems by disturbing the common reference branch 16.

The above drawback may be overcome by modifying the current/voltage converter 20 as shown in FIG. 3, in which a load transistor 23' of the array branch 17 and a load transistor 24' of the common reference branch 16 are diode-connected and do not have gate terminals connected to one another. As a result of the modification shown in FIG. 3, the transistors 23 and 24 shown in FIG. 2 are replaced by two transistors 23' and the transistor 24' each having a gate terminal, a drain terminal, and a source terminal. Such a solution, however, impairs the dynamic performance of the circuit because the terminals 28 of the array branches 17 reach at most a voltage of $V_{CC}-V_{TH}$, where $V_{CC}$ is a supply voltage along a line 30 to which the source terminals of the transistors 23' and 24' are connected, and $V_{TH}$ is a threshold voltage of the transistors 23', which is a minimum voltage drop between the source and gate terminals of the transistors 23' for them to be turned on. A reduction in dynamic performance, on the other hand, is to be avoided, and is by no means negligible when the circuit operates at low supply voltage.

SUMMARY OF THE INVENTION

According to principles of the present invention, there is provided a nonvolatile memory having a memory array including a plurality of data cells and a read circuit with a plurality of sense amplifiers where each sense amplifier is connected to a respective array branch for connection to the data cells. The nonvolatile memory includes a reference generating circuit having a reference cell arranged outside the memory array for generating a reference signal. The reference generating circuit also includes a plurality of reference branches where each reference branch is connected to a respective sense amplifier. The reference generating circuit further includes connection means interposed between the reference cell and the reference branches which supplies the reference branches with a first operating signal correlated to the reference signal.

BRIEF DESCRIPTION OF THE DRAWINGS

Two preferred, non-limiting embodiments of the present invention will be described by way of example with reference to the accompanying drawings, in which:

FIG. 3 shows a known alternative detail of the circuit shown in FIG. 2;

FIG. 4 shows an electrical schematic diagram of a circuit according to a first embodiment of the present invention;

FIG. 5 shows a graph of two quantities relative to the circuit shown in FIG. 4.

DETAILED DESCRIPTION OF THE INVENTION

Figure 1:
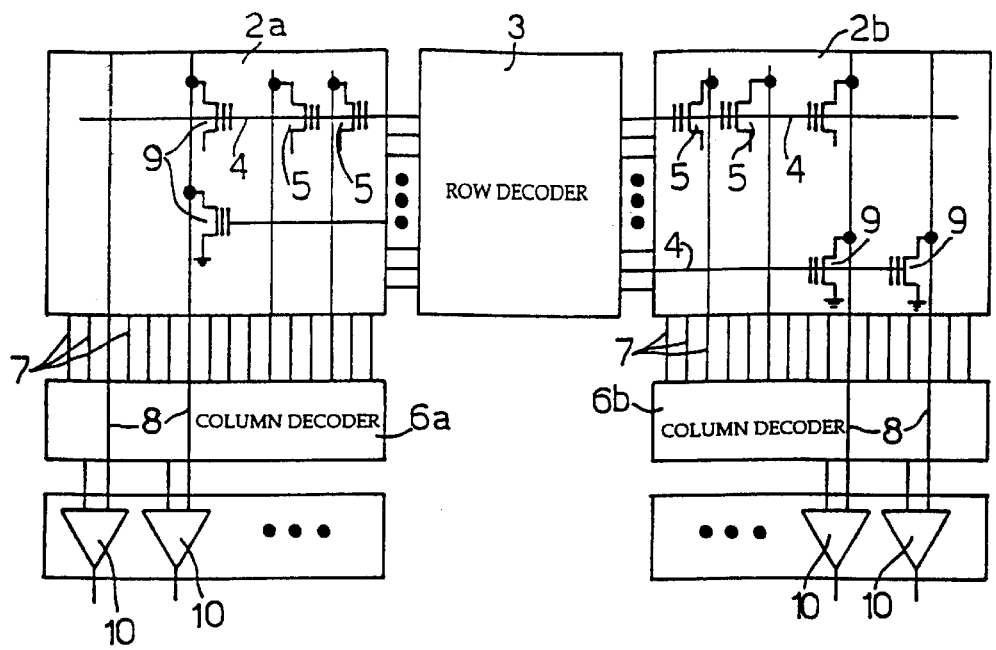
FIG. 1 shows a block diagram of a known memory array and related read circuits.
Figure 2:
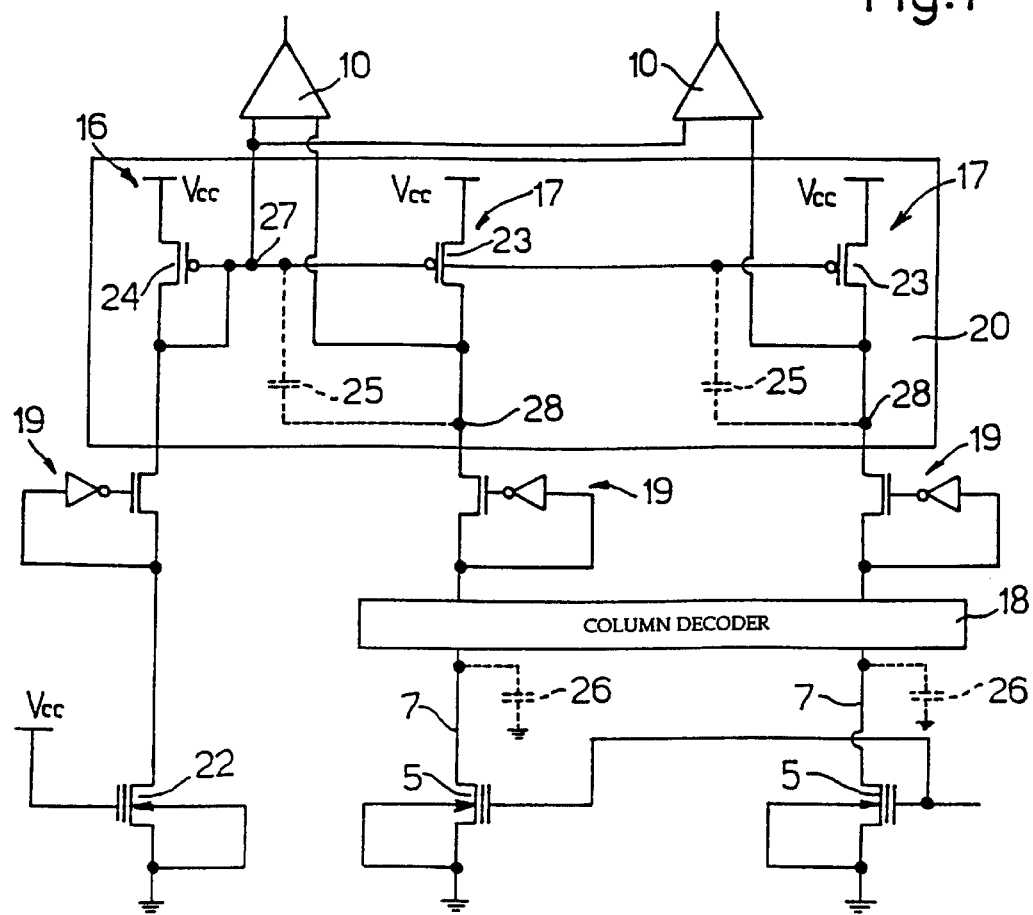
FIG. 2 shows an electrical schematic diagram of a known read circuit.

A nonvolatile memory 35 according to a first embodiment of the invention is shown in FIG. 4. With reference to FIG. 4, the nonvolatile memory 35 includes elements in common with the circuit shown in FIG. 2 which are given the same reference numerals. With respect to the nonvolatile memory 35, only the elements pertinent to the present invention are shown, including a read circuit 40, a column decoder 6, a memory array 2, and a reference signal generating circuit 55.

The read circuit 40 comprises a plurality of sense amplifiers 10, only two of which are shown, each sense amplifier 10 having a first input connected to a respective array branch 17, and a second input connected to a respective reference branch 41. Each array branch 17 comprises a PMOS load transistor 23 with a source terminal connected to a supply line 42 at a voltage $V_{CC}$, a gate terminal connected to a node 43, and a drain terminal connected to a node 44. A column decoder 6 connects one of a plurality of bit lines 7 at a time to the node 44 via a biasing circuit 19 and each bit line 7 is connected to a plurality of data cells 5 forming a part of the memory array 2. The biasing circuit 19, which prevents spurious or soft writing of the data cells 5, comprises an NMOS transistor 47 with a drain terminal connected to the node 44 and a source terminal connected to the column decoder 6. An inverter 48 has an input connected to the source terminal of the transistor 47, and an output connected to a gate terminal of the transistor 47 to control a power-on level of the transistor 47. The inverter 48 maintains the bit line 7 at a desired biasing voltage (typically 1 V) in a negative feedback manner when it is connected to the array branch 17.

Each reference branch 41 comprises a respective diode-connected PMOS load transistor 50 with a source terminal connected to the supply line 42, and gate and drain terminals connected to each other and also to the node 43. A biasing circuit 51, which is similar to the biasing circuit 19, is interposed between the node 43 and a drain terminal of an NMOS native or low-threshold-voltage transistor 53 that has a source terminal connected to a ground. Each of the native transistors 53 of the reference branches 41 has a gate terminal connected to the gate terminals of the other native transistors 53. A gate terminal of a single NMOS native transistor 54 is connected to the gate terminals of each of the native transistors 53 to form a current mirror with the native transistors 53. The native transistors 53 and 54 have the same dimensional W/L or channel width/length ratio so as to form a 1:1 current mirror. The native transistor 54 is part of a reference signal generating circuit 55.

The reference signal generating circuit 55 comprises a single flash reference cell 60, located outside the memory array 2, with a gate terminal connected to supply the line 42 at the voltage $V_{CC}$, a source terminal connected to a ground, and a drain terminal coupled to a drain terminal of a PMOS transistor 62 via a biasing circuit 61 that is similar to the biasing circuit 19. The transistor 62 has a source terminal connected to the supply line 42, and is diode-connected with drain and gate terminals connected to each other and to a gate terminal of a PMOS transistor 63 so as to form a 1:1 current mirror circuit with the transistor 62. The transistor 63 has a source terminal connected to the supply line 42, and a drain terminal coupled to a drain terminal of the native transistor 54 via a biasing circuit 64 that is similar to the biasing circuit 19.

In the nonvolatile memory 35, a current $I_R$ flows through the reference cell 60 and is mirrored by the current mirror circuit formed by the transistors 62 and 63 to the native transistor 54 in which a current $I_1$ flows and also by the current mirror circuit formed by the native transistors 54 and 53 to the reference branches 41 in which two respective currents $I_2$ flow. The biasing circuits 61, 64, and 51 provide for biasing the drain terminals of the reference cell 60 and the native transistors 54 and 53 at the same voltage as the data cells 5 to ensure that the native transistors 53 are in the same condition as the native transistor 54. The biasing circuits 61, 64, and 51 also ensure that the currents $I_2$ are actually equal to the current $I_1$, and hence are also equal to the current $I_R$ in the reference cell 60, and that the reference branches 41 are in the same condition as the array branches 17.

However, as the voltage $V_{CC}$ increases, the currents $I_R$ and $I_2$ tend to diverge if the operating conditions of the reference cell 60 and the native transistor 54 are not exactly the same. Furthermore, a drain-source voltage drop $V_{DS}$ of the native transistor 53 may be different from a drain-source voltage drop $V_{DS}$ of the native transistor 54 due to the voltage drop $V_{DS}$ of the native transistor 54 being imposed by the reference cell 60 via the current mirror circuit formed by the transistors 62 and 63 and the voltage drop $V_{DS}$ of the native transistor 53 being dependent on the performance of its respective reference branch 41 and hence the read circuit 40. A plot of the currents $I_R$ and $I_2$ versus $V_{CC}$ is shown in FIG. 5; as shown, initially both of the currents $I_R$ and $I_2$ increase in the same way, but then they diverge slightly, with the current $I_2$ in the native transistor 53 becoming greater than the current $I_R$ in the reference cell 60, possibly resulting in read errors or uncertainty.

Figure 6:
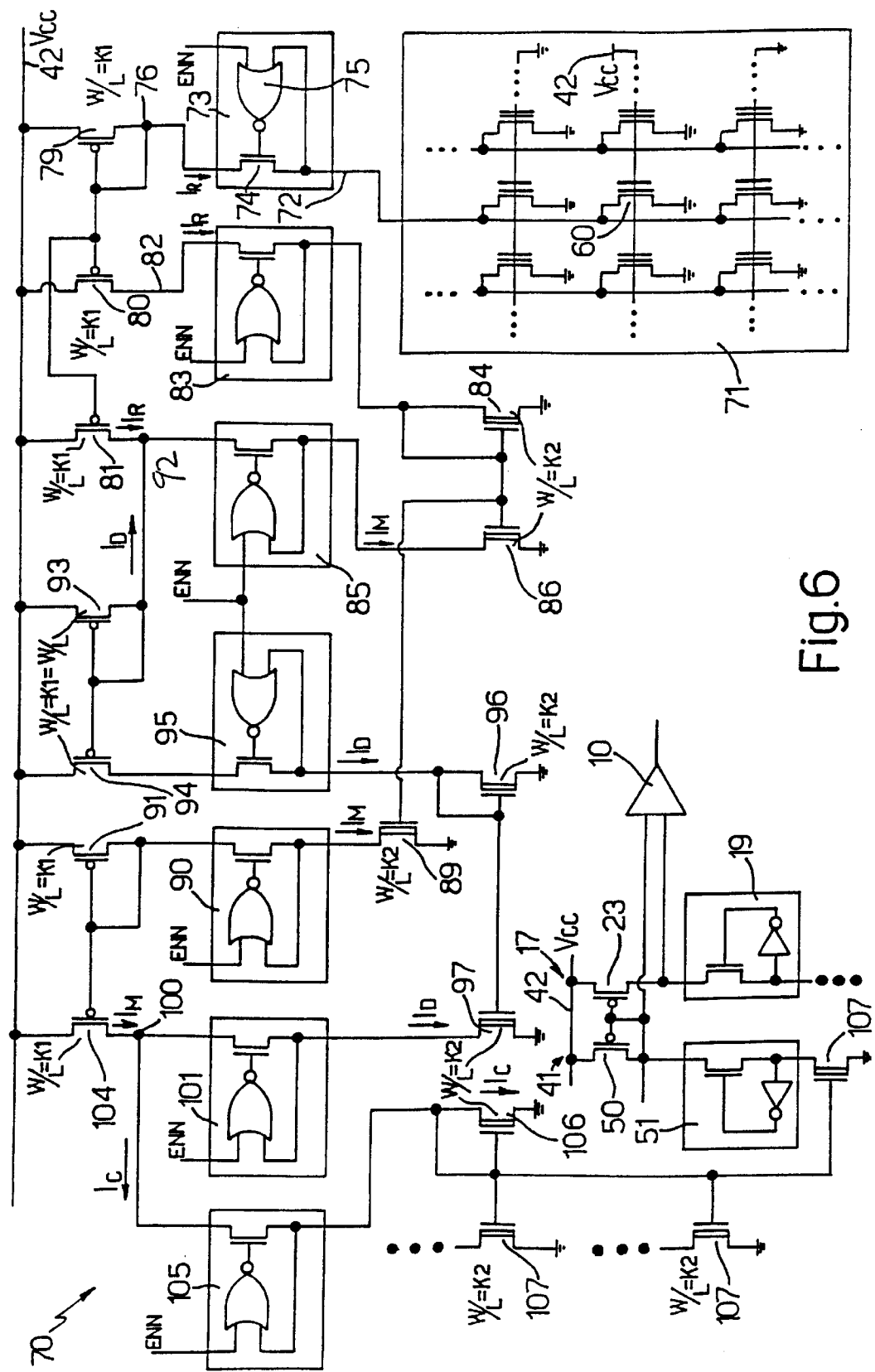
FIG. 6 shows a schematic diagram of a circuit according to a second embodiment of the present invention.

In order to solve this problem, a reference signal generating circuit 70 is shown in FIG. 6 according to a second embodiment of the invention. The reference signal generating circuit 70 is coupled to a read circuit similar to the read circuit 40 shown in FIG. 4, and similar elements have been given the same reference numerals. The reference signal generating circuit 70 performs a "predictive" equalizing function by generating a current equal to a difference between a current in a reference cell 60 and a current in a first MOS transistor connected to the cell by two current mirror circuits, which is caused by differing operating conditions and geometry, and subtracting the difference current from the current flowing in another MOS transistor.

More specifically, the reference cell 60 forms part of a small array 71 of, for example, 8×8 reference cells separated from a memory array (not shown). The reference cell 60 is selected from among the innermost cells of the small array 71 to reduce edge effects, and has a gate terminal connected to a supply line 42 at a voltage $V_{CC}$, a source terminal connected to a ground, and a drain terminal connected to a line 72. The line 72 is connected to a biasing circuit 73 that is similar to the biasing circuit 19 shown in FIG. 4 and includes an enabling input. More specifically, the biasing circuit 73 comprises an NMOS transistor 74 with a source terminal connected to the line 72, a drain terminal defining a node 76, and a gate terminal connected to an output of a NOR gate 75. The NOR gate 75 has a first input connected to the source terminal of the transistor 74, and a second input receiving an inverted enabling signal ENN. Consequently, when the signal ENN is low, the NOR gate 75, like the biasing circuit 19 described above, maintains the line 72, and hence the drain terminal of the reference cell 60, at a desired bias voltage of 1 V. When the signal ENN is high, it forces the output of NOR gate 75 low so as to turn off the transistor 74, thus cutting off the connection between the node 76 and the reference cell 60, and reducing power consumption in a standby mode.

A diode-connected PMOS load transistor 79 has a source terminal connected to the supply line 42, and gate and drain terminals connected to the node 76, and has a dimensional channel width/length ratio W/L=K1. The transistor 79 is connected so as to form a current mirror with two PMOS transistors 80 and 81, both of which similarly have a dimensional channel width/length ratio W/L=K1. The transistor 80 has a source terminal connected to the supply line 42, a gate terminal connected to the node 76, and a drain terminal connected to a node 82. Through a biasing circuit 83 that is similar to the biasing circuit 73, the node 82 is coupled to a drain terminal of an NMOS native transistor 84, which is diode-connected, and has a source terminal connected to the ground, and a dimensional channel width/length ratio W/L=K2.

The transistor 81 has a source terminal connected to the supply line 42, a gate terminal connected to the node 76, and a drain terminal defining a node 92 which is coupled, via a biasing circuit 85 that is similar to the biasing circuit 73, to a drain terminal of an NMOS native transistor 86, which has a gate terminal connected to a gate terminal of the native transistor 84, and a source terminal connected to the ground. The native transistor 86 has the same dimensional channel width/length ratio W/L=K2 as the native transistor 84 with which it forms a 1:1 current mirror circuit. The native transistor 84 is connected to form a current mirror circuit with a further NMOS native transistor 89, which also has a dimensional channel width/length ratio W/L=K2. The native transistor 89 has a drain terminal coupled, via a biasing circuit 90 that is similar to the biasing circuit 73, to a drain terminal of a diode-connected PMOS transistor 91, which has a source terminal connected to the supply line 42.

The node 92 is also connected to a drain terminal of a diode-connected PMOS transistor 93, which has a source terminal connected to the supply line 42. The transistor 93 has a dimensional channel width/length ratio W/L=K1, and is connected to form a current mirror circuit with a PMOS transistor 94. The transistor 94 has a source terminal connected to the supply line 42, and a drain terminal coupled, via a biasing circuit 95 that is similar to the biasing circuit 73, to a drain terminal of a diode-connected NMOS native transistor 96. The native transistor 96 has a source terminal connected to the ground, a gate terminal connected to a gate terminal of an NMOS native transistor 97, and has a dimensional channel width/length ratio W/L=K2. The native transistor 97 has a source terminal connected to the ground, a drain terminal coupled to a node 100 via a biasing circuit 101 that is similar to the biasing circuit 73, and has the same dimensional channel width/length ratio W/L as the native transistor 96 with which it is connected to form a current mirror circuit. A PMOS transistor 104 has a source terminal connected to the supply line 42, a drain terminal connected to the node 100, and a gate terminal connected to a gate terminal of the transistor 91. The transistors 104 and 91 have the same dimensional channel width/length ratio W/L=K1, thus forming a 1:1 current mirror circuit.

An NMOS native transistor 106, which is similar to the native transistor 54 shown in FIG. 4, has a drain terminal coupled, via a biasing circuit 105 that is similar to the biasing circuit 73, to the node 100. The native transistor 106, like the native transistor 54, is further connected to form a current mirror circuit with a plurality of transistors 107. Each transistor 107 is included in a respective reference branch 41. The native transistor 106 is diode-connected, and has a source terminal connected to the ground, and a gate terminal connected to the drain terminal and also to gate terminals of each of the transistors 107. The native transistor 106 has the same dimensional channel width/length ratio W/L=K2 as each of the transistors 107. Each transistor 107 has a source terminal connected to the ground and a drain terminal connected to a respective biasing circuit 51.

The circuit shown in FIG. 6 operates as follows.

The native transistor 84 is similar to the native transistor 54 shown in FIG. 4. The native transistor 86, connected to form a current mirror circuit with the native transistor 84, is similar to the native transistors 53 shown in FIG. 4, except that it is coupled to two load transistors 81 and 93 instead of one. As such, a current $I_M$ flows through the native transistor 86. The current $I_M$ is similar to the current $I_2$ in the native transistors 53, and is slightly different from the current $I_R$ flowing in the reference cell 60, the transistor 79, and in the transistors 80 and 81 that form a current mirror with the transistor 79. Therefore the transistor 93, by which the native transistor 86 is supplied with a difference between the current $I_M$ drawn by the native transistor 86 and the current $I_R$ supplied by the transistor 81, provides a current $I_D = I_M - I_R$, which is mirrored to the transistor 94. The current $I_D$ is supplied to the native transistor 96, and is mirrored again to the transistor 97. The current $I_M$ in the native transistor 86 is also mirrored to the native transistor 89 and is supplied to the transistors 91 and 104. A compensated current $I_C$ is supplied by the node 100 and drawn by the native transistor 106 which equals a difference between the current $I_M$ in the transistor 104 and the current $I_D$ in the transistor 97 according to the following equation:

$$I_C = I_M - I_D = I_M - (I_M - I_R) = I_R$$

The current $I_C$ is supplied to and mirrored by the native transistor 106 to the transistors 107 of the various read circuits. That is to say, the native transistor 106 presents a different drain-source voltage $V_{DS}$, as compared with the native transistor 54 shown in FIG. 4, and is therefore capable of supplying the various read circuits with a compensated current $I_C$ practically equal to the current $I_R$ generated by the reference cell 60.

The above circuits exploit the advantages of locating reference cells outside a memory array, for accurately regulating a threshold voltage, and hence a current supply for a given supply voltage. The above described circuits eliminate capacitive coupling problems, and hence the effect of voltage variations in an array branch on current and voltage values in a reference branch. Moreover, the circuit shown in FIG. 6 also eliminates effects due to a less than ideal nature of the circuit which may be especially sensitive to high supply voltages.

The embodiments of the invention described are simple and easy to integrate with no additional integrated circuit area required. In comparison to the case where reference cells are integrated in a memory array, the integration area is actually reduced and the layout is optimized by locating generating circuits in appropriate spaces already available on the chip.

Clearly, changes may be made to the memory as described and illustrated herein without departing from the scope of the present invention.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A reference current generating circuit for a nonvolatile memory, the nonvolatile memory having a memory array with a plurality of data cells and a read circuit with a plurality of sense amplifiers, each sense amplifier being connected to a respective array branch for connection to said data cells, the reference current generating circuit comprising:
   a reference cell separated from the memory array;
   a plurality of reference branches, each reference branch coupled to a respective sense amplifier; and
   a predictive equalizing circuit coupled between the reference cell and the reference branches and being structured to generate a first current based on the reference cell and a compensated current based on the first current, the predictive equalizing circuit being coupled to provide the compensated current to the reference branches as a reference current.

2. A reference signal generating circuit for a nonvolatile memory, the nonvolatile memory having a memory array with a plurality of data cells and a read circuit with a plurality of sense amplifiers, each sense amplifier being connected to a respective array branch for connection to said data cells, the reference signal generating circuit comprising:
   a reference cell separated from the memory array;
   a plurality of reference branches, each reference branch coupled to a respective sense amplifier; and
   a predictive equalizing circuit coupled between the reference cell and the reference branches and being structured to generate a first signal based on the reference cell and a compensated signal based on the first signal, the predictive equalizing circuit being coupled to provide the compensated signal to the reference branches as a reference signal, wherein the predictive equalizing circuit comprises:
   a first circuit coupled to the reference cell and being structured to generate the first signal;
   a second circuit coupled to the first circuit and being structured to generate a second signal based on the first signal;
   a third circuit coupled to the first circuit and to the second circuit, the third circuit being structured to generate a third signal based on the first signal and the second signal;
   a fourth circuit coupled to the second circuit and being structured to transfer the second signal;
   a fifth circuit coupled to the third circuit and to the fourth circuit, the fifth circuit being structured to transfer the third signal;
   a sixth circuit coupled to the fourth circuit and to the fifth circuit, the sixth circuit being structured to generate the compensated signal based on the second signal and the third signal such that the compensated signal is substantially equal to the first signal; and
   wherein the sixth circuit is coupled to provide the compensated signal to each of the reference branches.

3. The reference signal generating circuit as claimed in claim 2 wherein the first signal, the second signal, the third signal, and the compensated signal are current signals, and the compensated signal is based on a difference between the third signal and the second signal.

4. The reference signal generating circuit as claimed in claim 2, further comprising a plurality of biasing circuits, each biasing circuit being coupled between two of the first, second, third, fourth, fifth, and sixth circuits, and each biasing circuit having an input to receive an enabling signal to enable the predictive equalizing circuit to provide the compensated signal.

5. The reference signal generating circuit as claimed in claim 4 wherein the enabling signal enables the predictive equalizing circuit to generate the first, second, and third signals.

6. The reference signal generating circuit as claimed in claim 1 wherein the reference cell is included in a small array of cells having inner cells and outer cells, the reference cell being selected from the inner cells of the small array of cells.

7. The reference signal generating circuit as claimed in claim 2 wherein the first, second, third, fourth, fifth, and sixth circuits are current mirror circuits.

8. A method for reading a data cell in a nonvolatile memory having an array of data cells, comprising:
   generating a first current based on a reference cell;
   generating a second current based on the first current;
   generating a third current based on the first current and the second current;
   generating a compensated current based on the second current and the third current;
   providing the compensated current to a transistor in a reference branch in the memory array;
   generating a data cell current based on the data cell in the memory array; and
   comparing the compensated current with the data cell current to read the data cell.

9. The method as claimed in claim 8 wherein the step of generating the third current comprises the step of combining the first and the second current.

10. The method as claimed in claim 8 wherein the step of generating the compensated current comprises the step of generating the compensated current based on a difference between the third current and the second current.

11. A method for generating a reference current in a nonvolatile memory having an array of data cells, comprising:

generating a first current based on a reference cell;
generating a second current based on the first current;
generating a third current based on the first current and the second current;
generating a compensated current based on a difference between the third current and the second current; and
providing the compensated current to a transistor in a reference branch in the memory array as the reference current.

12. A nonvolatile memory having a memory array including a plurality of data cells, a read circuit having a plurality of sense amplifiers, each sense amplifier being connected to a respective array branch for connection to said data cells, and a reference current generating circuit comprising a reference cell arranged outside said memory array for generating a reference current, and a plurality of reference branches, each reference branch being connected to a respective sense amplifier, and connection means interposed between said reference cell and said reference branches for supplying said reference branches with a first operating current correlated to said reference current.

13. A nonvolatile memory as claimed in claim 12 wherein said connection means comprises current mirror means.

14. A nonvolatile memory having a memory array including a plurality of data cells, a read circuit having a plurality of sense amplifiers, each sense amplifier being connected to a respective array branch for connection to said data cells, and a reference generating circuit, said reference generating circuit comprising a reference cell arranged outside said memory array for generating a reference signal, and a plurality of reference branches, each reference branch being connected to a respective sense amplifier, and connection means interposed between said reference cell and said reference branches for supplying said reference branches with a first operating signal correlated to said reference signal, a first current mirror circuit and a second current mirror circuit, said first current mirror circuit having a control input coupled to said reference cell and an output and said second current mirror circuit comprising a control element coupled to said output of said first current mirror circuit, and a mirroring element connected to said reference branches.

15. A nonvolatile memory as claimed in claim 14 wherein said first current mirror circuit comprises a first transistor and a second transistor, said first transistor being diode-connected and interposed between a first reference potential line and said reference cell, said first transistor having a control terminal, said second transistor being connected between said first reference potential line and said second current mirror circuit, said second transistor having a control terminal connected to said control terminal of said first transistor, wherein said control element comprises a diode-connected third transistor interposed between a second reference potential line and said second transistor, and having a control terminal, and wherein said mirroring element comprises a plurality of fourth transistors, each fourth transistor having a first terminal connected to said second reference potential line, a second terminal coupled to a respective one of said reference branches, and a control terminal connected to said control terminal of said third transistor.

16. A nonvolatile memory as claimed in claim 15, further comprising predictive equalizing means interposed between said fourth transistor and said reference branches.

17. A nonvolatile memory as claimed in claim 16 wherein said predictive equalizing means comprises a fifth transistor current-mirror-connected to said first transistor and interposed between said first reference potential line and a thirteenth transistor, a sixth transistor coupled between said first reference potential line and said thirteenth transistor, a seventh transistor current-mirror-connected to said sixth transistor, an eighth transistor interposed between said seventh transistor and said second reference potential line, a ninth transistor current-mirror-connected to said eighth transistor, a tenth transistor current-mirror-connected to said thirteenth transistor, an eleventh transistor coupled between said first reference potential line and said tenth transistor, a twelfth transistor current-mirror-connected to said eleventh transistor and interposed between said first reference potential line and said ninth transistor, wherein said third transistor is coupled between said twelfth transistor and said second reference potential line, and wherein said plurality of fourth transistors are current-mirror-connected to said third transistor and each fourth transistor is coupled to a respective reference branch.

18. A nonvolatile memory as claimed in claim 17 wherein said first, second, fifth, sixth, seventh, eleventh and twelfth transistors are PMOS transistors, and wherein said third, fourth, eighth, ninth, tenth, and thirteenth transistors are native NMOS transistors.

19. A nonvolatile memory having a memory array including a plurality of data cells, a read circuit having a plurality of sense amplifiers, each sense amplifier being connected to a respective array branch for connection to said data cells, and a reference generating circuit, said reference generating circuit comprising a reference cell arranged outside said memory array for generating a reference signal, and a plurality of reference branches, each reference branch being connected to a respective sense amplifier, and connection means interposed between said reference cell and said reference branches for supplying said reference branches with a first operating signal correlated to said reference signal, said connection means including generating means coupled to said reference cell and generating a second operating signal correlated to said reference signal and presenting an error, first subtracting means coupled to said reference cell and to said first generating means, said first subtracting means generating an error signal proportional to said error, and second subtracting means coupled to said first subtracting means and to said generating means, said second subtracting means generating said first operating signal as a difference between said second operating signal and said error signal.

20. A nonvolatile memory as claimed in any one of claims 12–19, further comprising a reference memory array separated from said memory array, wherein said reference cell forms part of said reference memory array.

* * * * *